(12) United States Patent
Migita et al.

(10) Patent No.: US 6,461,737 B2
(45) Date of Patent: Oct. 8, 2002

(54) EPITAXIAL COMPOUND STRUCTURE AND DEVICE COMPRISING SAME

(75) Inventors: Shinji Migita; Shigeki Sakai, both of Tsukuba (JP)

(73) Assignee: Agency of Industrial Science & Technology, Ministry of International Trade & Industry, Tokyo (JP)

( * ) Notice: Subject to any disclaimer, the term of this patent is extended or adjusted under 35 U.S.C. 154(b) by 111 days.

(21) Appl. No.: 09/734,554

(22) Filed: Dec. 13, 2000

(65) Prior Publication Data

US 2001/0013311 A1 Aug. 16, 2001

(30) Foreign Application Priority Data

Dec. 14, 1999  (JP) ............................ 11-354889

(51) Int. Cl.$^7$ .................... B32B 23/04; H01L 39/12
(52) U.S. Cl. ................ 428/446; 428/697; 428/699; 428/701; 505/230; 505/237; 505/238
(58) Field of Search ................. 428/446, 689, 428/697, 699, 700, 701, 702, 930; 505/230, 234, 235, 236, 237, 238, 239, 813

(56) References Cited

U.S. PATENT DOCUMENTS

| | | | | |
|---|---|---|---|---|
| 5,356,831 A | * | 10/1994 | Calviello et al. | 117/105 |
| 5,420,102 A | * | 5/1995 | Harshavardhan et al. | 428/688 |
| 5,593,951 A | * | 1/1997 | Himpsel | 428/688 |
| 5,834,803 A | * | 11/1998 | Nashimoto | 257/295 |
| 5,912,068 A | * | 6/1999 | Jia | 257/636 |
| 5,985,404 A | * | 11/1999 | Yano et al. | 428/141 |
| 6,022,832 A | * | 2/2000 | Fritzemeier et al. | 117/102 |
| 6,099,653 A | * | 8/2000 | Bhandari et al. | 118/726 |
| 6,151,240 A | * | 11/2000 | Suzuki | 257/295 |
| 6,235,402 B1 | * | 5/2001 | Shoup et al. | 117/944 |
| 6,242,298 B1 | * | 6/2001 | Kawakubo | 438/239 |
| 6,278,138 B1 | * | 8/2001 | Suzuki | 257/103 |

\* cited by examiner

*Primary Examiner*—Tom Dunn
*Assistant Examiner*—Colleen Cooke
(74) *Attorney, Agent, or Firm*—Oblon, Spivak, McClelland, Maier & Neustadt, P.C.

(57) ABSTRACT

An epitaxial compound structure has a crystal structure including fluorite crystal on which is epitaxially grown a film of simple perovskite crystal with a (011) orientation.

21 Claims, 9 Drawing Sheets

FERROELECTRIC MATERIAL CRYSTAL WITH
LAYERED PEROVSKITE STRUCTURE ($Bi_4Ti_3O_{12}$)

[001]  [117]  (001) PLANE (001) PLANE
[011]
[001] [010] SIMPLE PEROVSKITE CRYSTAL ($SrTiO_3$)

(111) DIFFRACTION OF $CeO_2$ (001) DIFFRACTION OF $SrTiO_3$

EPITAXIAL COMPOUND STRUCTURE AND DEVICE COMPRISING SAME

BACKGROUND OF THE INVENTION

1. Field of the Invention

The present invention relates to an epitaxial compound structure having a crystal structure comprising fluorite crystal on which is epitaxially grown a thin film of simple perovskite crystal having a (011) orientation, and ferroelectric devices and superconducting devices comprising the compound structure.

2. Description of the Prior Art

Crystal having a layered perovskite structure is known to have various properties, such as ferroelectricity, superconductivity and magnetism. Ferroelectric devices, superconducting devices and many other devices have been fabricated using these properties. These properties are highly dependent on the crystal orientation, with an orientation perpendicular to the [001] orientation providing the best characteristics. In the case of a ferroelectric material, for example, polarization and coercive electric field are greatest at the orientation perpendicular to [001], and in a superconducting material, current flows most readily when the crystal orientation is perpendicular to the [001] orientation. Therefore, in order to realize high-performance devices, it is desirable to make every effort to epitaxially grow thin films of layered perovskite with an orientation perpendicular to the [001].

However, a characteristic of perovskite having a layered structure is that it readily grows two-dimensionally in the (001) plane perpendicular to the [001] orientation. As a result, there is a problem in that thin films grown on the substrate grow with a (001) orientation in which the [001] orientation is perpendicular to the substrate surface, making it difficult to achieve epitaxial growth not parallel to [001], for example, perpendicular to [001] or at an incline relative to [001].

Using polycrystalline thin films instead of epitaxially grown single-crystal thin films has been proposed as a method of overcoming this problem. However, this gives rise to a fresh set of problems in that, unlike single-crystal films, in polycrystalline films the direction in which the grains grow is not uniform, and as a result, the characteristics differ from location to location. Moreover, in some cases, in addition to the target crystals, there may also be an intermixing of another crystal phase, or amorphous phase. Devices fabricated using polycrystalline film having a layered perovskite structure exhibit variations in characteristics, and make it difficult to achieve higher integration.

The present inventors conducted extensive research and experimentation relating to the use of perovskite having a layered crystalline structure to fabricate reliable, high-performance devices that are also capable of higher integration. This led to the discovery that in order to grow a crystal structure on the substrate surface that was as parallel as possible to the [001] orientation of the layered perovskite structure, it was also necessary to focus on the crystalline layer constituting the substrate. Based on further research, it was discovered that an epitaxial compound structure comprising a thin film of simple perovskite epitaxially grown with a (011) orientation on a substrate of (001) fluorite was effective, which enabled this invention to be perfected.

An object of the present invention is to provide an epitaxial compound structure that can be used as a crystalline material for fabricating reliable, high-performance devices that are also capable of higher integration, and a device using the structure.

SUMMARY OF THE INVENTION

In accordance with the present invention, there is provided an epitaxial compound structure, comprising a (001)-oriented film of fluorite crystal, and a (011)-oriented film of simple perovskite crystal grown epitaxially on the film of fluorite crystal.

The above compound structure also includes the film of fluorite crystal being a (001)-oriented film epitaxially grown on a conductive crystal. The compound structure also includes silicon as the conductive crystal.

The present invention also provides an epitaxial compound structure, comprising a (001)-oriented film of fluorite crystal, a (011)-oriented film of simple perovskite crystal grown epitaxially on the film of fluorite crystal, and a crystal film having a layered perovskite structure grown epitaxially on the film of simple perovskite crystal.

The above compound structure also includes the film of fluorite crystal being a (001)-oriented film epitaxially grown on a conductive crystal. The compound structure also includes silicon as the conductive crystal. The compound structure also includes the crystal film having a layered perovskite structure that is a ferroelectric material, a superconducting material or a magnetic material. Also included are a ferroelectric device comprising the crystal film having a layered perovskite structure that is a ferroelectric material, and a superconducting device comprising the crystal film having a layered perovskite structure that is a superconducting material.

In accordance with the present invention, by combining fluorite crystal and simple perovskite crystal, simple perovskite crystal can be epitaxially grown with a (011) orientation, enabling an epitaxial compound structure that can be used as a high-performance crystal material for fabricating reliable, high-performance devices that can be fabricated with higher integration.

Further features of the invention, its nature and various advantages will be more apparent from the accompanying drawings and the following detailed description of the invention.

DESCRIPTION OF THE PREFERRED EMBODIMENTS

Figure 1:
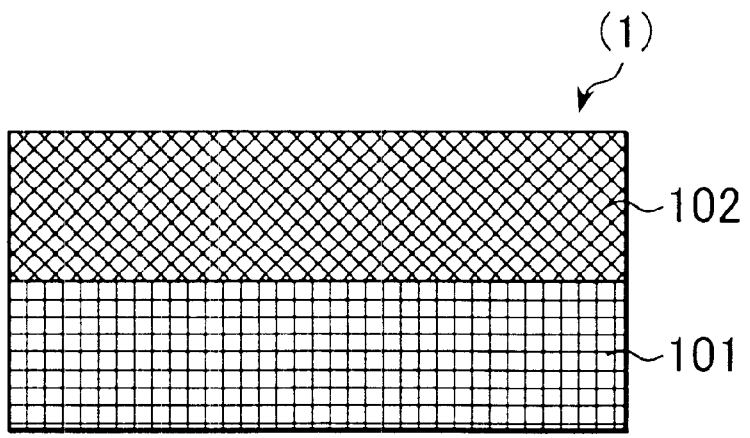
FIG. 1 is a cross-sectional view showing the layer structure of an epitaxial compound structure (1) according to the present invention.

The epitaxial compound structure (1) of the present invention comprises a simple perovskite crystal film with a (011) orientation epitaxially grown on (001)-oriented fluorite crystal. FIG. 1 is a cross-sectional view of the layer structure of the epitaxial compound structure (1). In FIG. 1, reference numeral 101 denotes an epitaxial fluorite crystal film with a (001) orientation, and numeral 102 denotes an epitaxial simple perovskite crystal with a (011) orientation.

The fluorite crystal 101 is a compound with a mainly cubic structure having the chemical formula $AX_2$ (where A is a positive element and X is a negative element) such as $CaF_2$ crystal in which A atoms form a face-centered cubic lattice and X atoms form a simple cubic lattice, with A atoms having eight X atoms configuring a cube and X atoms having four A atoms configuring a regular tetrahedron. Any of the materials known in the prior art such as $CaF_2$, $SrF_2$, $BaF_2$, $CeO_2$, $Ce_x$, $Zr_{1-x}O_2$ (0<x<1), $ZrO_2$ and $Y_xZr_{1-x}O_2$ (0<x<1)can be used as the fluorite. However, from the standpoint of promoting growth of simple perovskite with a (011) orientation, it is preferable to use a material having good lattice matching with the perovskite and high stability of the crystal structure.

The simple perovskite crystal 102 is a compound with a mainly cubic structure having the chemical formula $ABX_3$ (where A is a positive element, B is a positive element and X is a negative element) such as $CaTiO_3$ crystal, having A atoms at the lattice center, B atoms at the corners and X atoms at the center of edges. Any of the materials known in the prior art such as $CaTiO_3$, $SrTiO_3$, $BaTiO_3$, $Ba_xSr_{1-x}TiO_3$ (0<x<1), $SrRuO_3$, $LaCoO_3$, $SrCoO_3$, $La_xSr_{1-x}CoO_3$(0<x<1), $LaAlO_3$, $NdGaO_3$ and $PrGaO_3$ can be used as the perovskite. However, from the standpoint of promoting growth of simple perovskite with a (011) orientation, it is preferable to use a material having good lattice matching with the fluorite and high stability of the crystal structure.

The epitaxial compound structure (2) of this invention comprises the fluorite crystal film of the epitaxial compound structure (1) grown epitaxially with a (001) orientation on a conductive crystal. The epitaxial compound structure (3) of this invention comprises the epitaxial compound structure (2) in which the conductive crystal is silicon.

Figure 2:
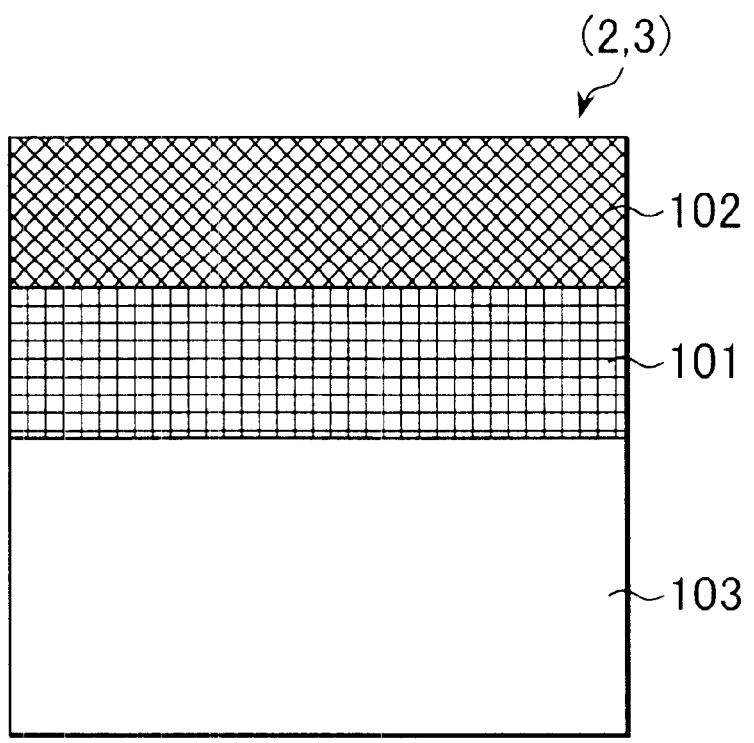
FIG. 2 is a cross-sectional view showing the layer structure of epitaxial compound structures (2) and (3) according to the present invention.

FIG. 2 is a cross-sectional view of the layer structure of the epitaxial compound structure (2) and (3). In FIG. 2, reference numeral 103 denotes conductive crystal, numeral 101 denotes a film of fluorite crystal grown epitaxially with a (001) orientation, and numeral 102 denotes a film of simple perovskite crystal grown epitaxially with a (011) orientation. Any of the conductive materials known in the prior art such as Si, GaAs and other compound semiconductors, Nb-doped $SrTiO_3$ and metals can be used as the conductive crystal 103. However, from the standpoint of actual use, it is preferable to use silicon as in the epitaxial compound structure (3). Similarly, as the fluorite crystal 101 and simple perovskite crystal 102 used in the epitaxial compound structure (2), there may be used the same crystal materials described with reference to the epitaxial compound structure (1). The silicon crystal and fluorite crystal film of the epitaxial compound structure (3) may be in direct contact, or a layer of a material such as silicon oxide may be provided at the interface to suppress diffusion and improve the electrical characteristics.

Figure 3:
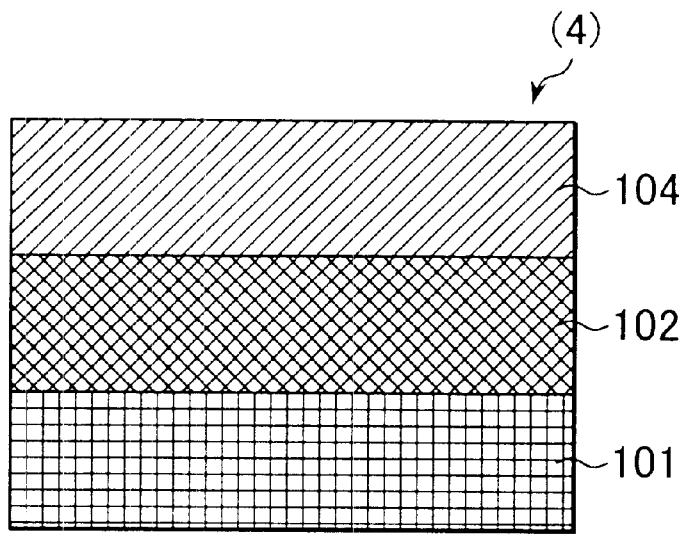
FIG. 3 is a cross-sectional view showing the layer structure of an epitaxial compound structure (4) according to the present invention.

The epitaxial compound structure (4) of the invention comprises a film of (011)-oriented simple perovskite crystal grown epitaxially on (001)-oriented fluorite crystal, on which is epitaxially grown a film of crystal having a layered perovskite structure. FIG. 3 is a cross-sectional view of the layers of the epitaxial compound structure (4). In FIG. 3, reference numeral 101 denotes a film of fluorite crystal grown epitaxially with a (001) orientation, numeral 102 denotes a film of simple perovskite crystal grown epitaxially with a (011) orientation, and numeral 104 denotes an epitaxially grown film having a layered perovskite crystal structure.

The crystal 104 with the layered perovskite structure used for the epitaxial compound structure (4) is a layered crystal structure having high anisotropy comprising a stack of one or more layers of a basic lattice of perovskite structure or pseudo perovskite structure alternating with a block of one or more layers represented by the chemical formula AX (A being a positive element and X being a negative element). In crystallographic terms, the long orientation of the periodic structure is given the notation [001].

Any of the prior art layered perovskite structures can be used as the crystal 104, including $Bi_4Ti_4O_{12}$, $SrBi_4Ti_4O_{15}$, $SrBi_2Ta_2O_9$, $SrBi_2Nb_2O_9$, $SrBi_2Ta_{1-x}Nb_xO_9$ (0<x<1), $La_{1-x}Sr_x$, $CuO_4$ (0<x<1), $YBa_2Cu_3O_{7-x}$ (0<x<1), $Bi_2Sr_2Ca_nCu_{n+1}O_{2n+6}$ (n=0,1, and 2), $TlBa_2Ca_nCU_{n+1}O_{2n+5}$ (n=1,2,3, and 4), $Tl_2Ba_2Ca_nCu_{n+1}O_{2n+6}$(n=0,1,2, and 3), $HgBa_2Ca_nCU_{n+1}O_{2n+}$(n=0,1,2, and 3), $Cu_{1-x}Ba_2Ca_{n-1}CU_nO_{2n+4}$ (n=4 and 5;0<x<1), $Bi_2Sr_2CoO_6$, $Sr_{n+1}V_nO_{3+1}$(n=1, 2, and 3), $Bi_2$ (Sr, Ca)$_2$ MnO$_6$, and $La_{2-2x}Ca_{1+2x}Mn_2O_7$ (0<x<1). However, from the standpoint of promoting growth of layered perovskite crystal with a (011) orientation, it is preferable to use a material that is similar to the simple perovskite structure and has good lattice matching with the simple perovskite and high stability of the crystal structure. Similarly, as the fluorite crystal 101 and simple perovskite crystal 102 used for the epitaxial compound structure (4), there may be used the same crystal materials described above with reference to the epitaxial compound structure (1).

The epitaxial compound structure (5) of this invention comprises a film of the fluorite crystal of the epitaxial compound structure (4) epitaxially grown with an (001) orientation on conductive crystal. The epitaxial compound structure (6) of this invention comprises the epitaxial compound structure (4) in which the conductive crystal is silicon.

Figure 4:
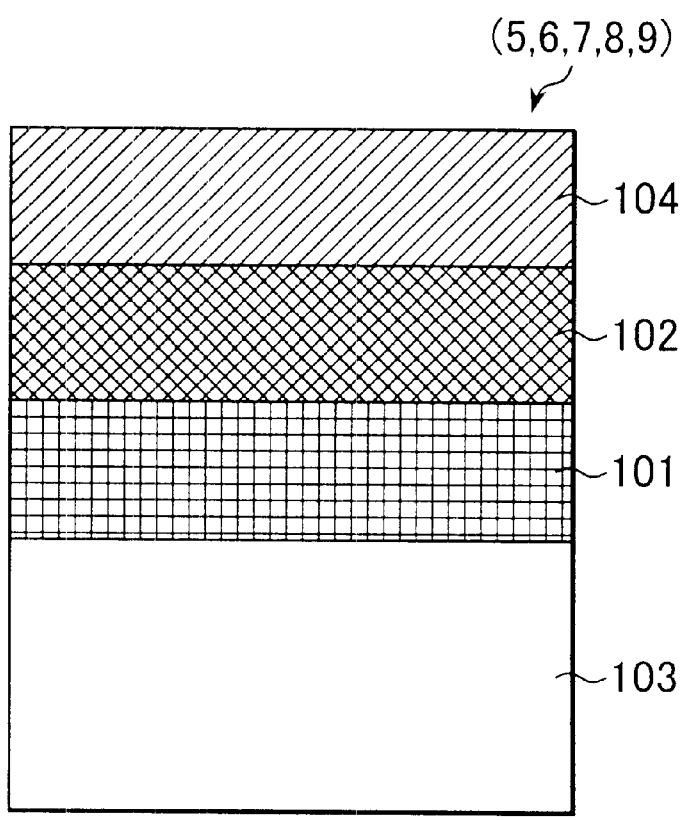
FIG. 4 is a cross-sectional view showing the layer structure of epitaxial compound structures (5) to (9) according to the present invention.

FIG. 4 is a cross-sectional view showing the layer structure of the epitaxial compound structures (5) to (9). In FIG.

4, reference numeral 103 denotes conductive crystal, numeral 101 denotes a film of fluorite crystal grown epitaxially with a (001) orientation, numeral 102 denotes a film of simple perovskite crystal grown epitaxially with a (011) orientation, and numeral 104 denotes an epitaxially grown film having a layered perovskite structure. While any of the conductive materials known in the prior art such as Si, GaAs and other compound semiconductors, Nb-doped $SrTiO_3$ and metals can be used as the conductive crystal 103, from the standpoint of actual use, it is preferable to use silicon, as in the case of epitaxial compound structure (6). Similarly, as the fluorite crystal 101, simple perovskite crystal 102 and film 104 having a layered perovskite structure used in the epitaxial compound structure (5), there may be used the same crystal materials described with reference to the epitaxial compound structure (4). As in the case of epitaxial compound structure (2), the silicon crystal and fluorite crystal film of the epitaxial compound structure (6) may be in direct contact, or a layer of a material such as silicon oxide may be provided at the interface to suppress diffusion and improve the electrical characteristics.

The epitaxial compound structure (7) of this invention comprises any of the epitaxial compound structures (4) to (6) in which the crystal 104 having a layered perovskite structure is a ferroelectric material. Materials that can be used as the crystal 104 include $Bi_4Ti_3O_{12}$, $SrBi_4Ti_4O_{15}$, $SrBi_2Ta_2O_9$, $SrBiNb_2O_9$, and $SrBi2Ta_{1-x}Nb_xO_9$ (0<x<).

The epitaxial compound structure (8) of the invention comprises any of the epitaxial compound structures (4) to (6) in which the crystal 104 having a layered perovskite structure is a superconductor. Materials that can be used as the crystal 104 include $La_{1-x}Sr_xCuO_4$ (0<x<1), $YBa_2Cu_3O_{7-x}$ (0<x<1), $Bi_2Sr_2Ca_nCu_{n+1}O_{2n+6}$ (n=0,1, and 2), $TlBa_2Ca_nCa_{n+1}O_{2n+5}$ (n=1, 2, 3, and 4), $Tl_2Ba_2Ca_nCu_{n+1}O_{2n+6}$ (n=0, 1, 2, and 3), $HgBa_2Ca_nCU_{n+1}O_{2n+4}$ (n=0, 1,2, and 3), $Cu_{1-x}Ba_2Ca_{n-1}Cu_nO_{2n+4}$ (n=4 and 5;0<x<1).

The epitaxial compound structure (9) of the invention comprises any of the epitaxial compound structures (4) to (6) in which the crystal 104 having a layered perovskite structure is a magnetic material. Materials that can be used as the crystal 104 include $Bi_2Sr_2CoO_6$, $Sr_{n+1}V_nO_{3n+1}$ (n=1, 2, and 3), $Bi_2 (Sr, Ca)_2 MnO_6$, and $La_{2-2x}Ca_{1+2x}Mn_2O_7$ (0<x<1).

As mentioned, in such epitaxial compound structures of the prior art, layered perovskite crystal readily grew two-dimensionally in the (001) plane perpendicular to the [001] orientation. As a result, films grown on the substrate grew as (001)-oriented films, making it difficult to achieve epitaxial growth not parallel to the [001], for example, perpendicular to the [001] or at an incline thereto. For the substrates in the epitaxial compound structures (1) to (3) of this invention, of the many crystals known in the prior art, fluorite and simple perovskite are skillfully combined to epitaxially grow a thin film of simple perovskite with a (011) orientation rather than the (001) orientation of the prior art. Also, the epitaxial compound structures (4) to (9) of the invention are layered perovskite structures epitaxially grown on the (011) surface of the above epitaxial compound structures. Compared to the (001)-oriented structures of the prior art, the resultant epitaxial compound structures exhibit markedly enhanced polarization, coercive electric field and current flow characteristics, and can be used to fabricate devices with higher integration.

It has not yet been ascertained why the epitaxial compound structures of this invention exhibits a (011) orientation. However, it can be postulated that it is a result of good lattice matching in the interface between the fluorite and the simple perovskite grown on the fluorite, and the fact that optimal use is made of the electrical affinity between the two when the simple perovskite has a (011) orientation.

Below, interfacial lattice matching in the epitaxial compound structures of the invention are explained with reference to FIGS. 5 and 6. However, it should be kept in mind that these explanations are just hypotheses.

Figure 5A:
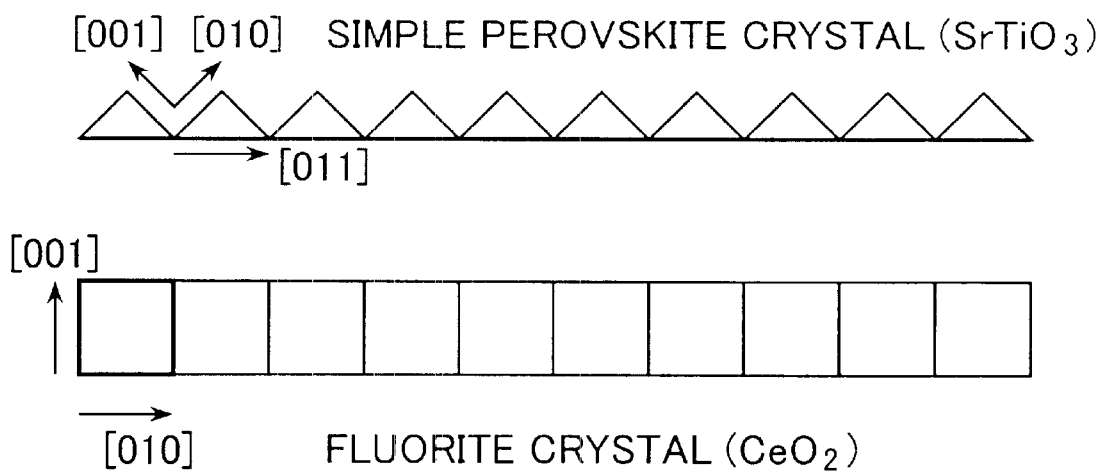
FIG. 5(a) is a cross-sectional view showing the lattice match at the interface between (011)-oriented $SrTiO_3$ simple perovskite and the (001) surface of $CeO_2$ fluorite in the structure of the epitaxial compound structures (1) to (3) of the present invention, viewed from the [100] orientation of the $CeO_2$.
Figure 5B:
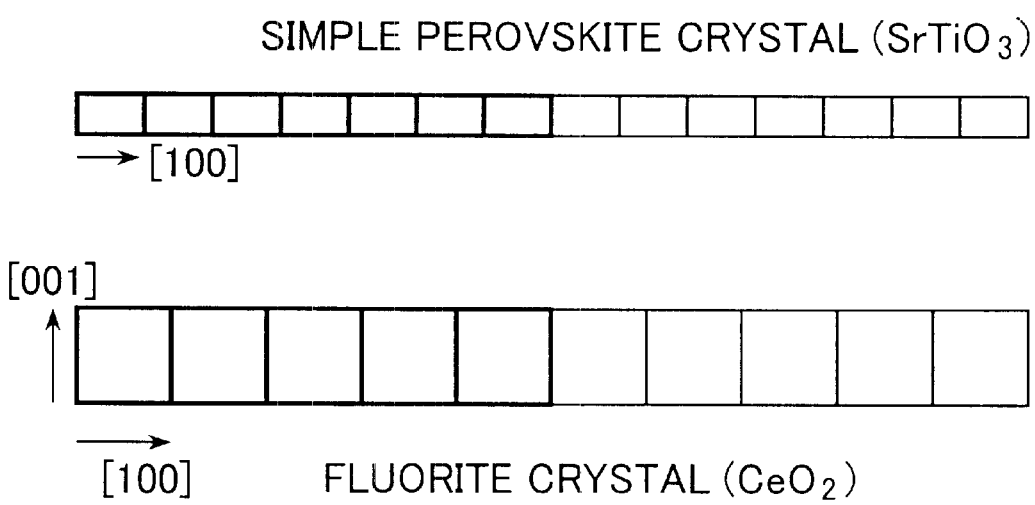
FIG. 5(b) is a cross-sectional view shown from the [010] orientation of the compound structures.

FIG. 5(a) is a cross-sectional view depicting the lattice matching at the interface between (011)-oriented $SrTiO_3$ simple perovskite and the (001) surface of $CeO_2$ fluorite in the structure of the epitaxial compound structures (1) to (3) of the invention, viewed from the [100] orientation of the $CeO_2$; and FIG. 5(b) is a cross-sectional view from the [010] aspect of the compound structure. The $CeO_2$ surface has a fourfold symmetry, so it is the same when the relationship between the [100] and [010] orientations of FIGS. 5(a) and 5(b) is reversed.

The unit cell length of the $CeO_2$ is around 5.4 Å and that of the $SrTiO_3$ about 3.9 Å.

The length of the [011] of the $SrTiO_3$ is $$3.9\ Å \times \sqrt{2} \approx 5.5\ Å$$

which substantially matches the [010] length of the $CeO_2$. This aspect is what is shown from the $CeO_2$ [100] in FIG. 5 (a).

Now, seven times the length of the $SrTiO_3$ [100] is $$3.9\ Å \times 7 \approx 27.3\ Å$$

and five times the length of the $CeO_2$ [100] is $$5.4\ Å \times 5 \approx 27.0\ Å$$

so these lattices match over the long period. This is the aspect shown in FIG. 5(b) from the $CeO_2$ [010]. Thus, since there is lattice matching along the two orthogonal directions, a film of (011)-oriented $SrTiO_3$ simple perovskite can be epitaxially grown on (001)-oriented $CeO_2$ fluorite.

Figure 6:
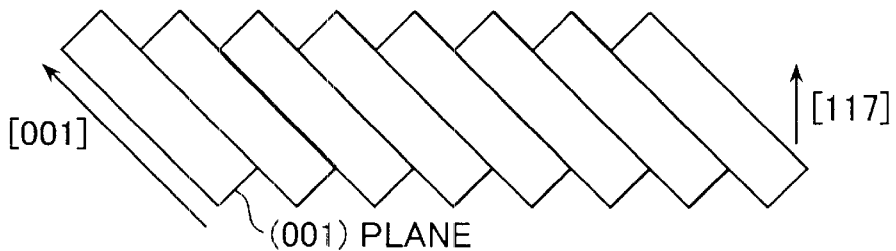
FIG. 6 is a cross-sectional view showing the lattice match at the interface between (011)-oriented $SrTiO_3$ as the simple perovskite crystal, and $Bi_4Ti_3O_{12}$ as the layered perovskite crystal structure of the epitaxial compound structures (4) to (9) of the present invention, viewed from the [100] orientation of the simple perovskite crystal.
Figure 6:
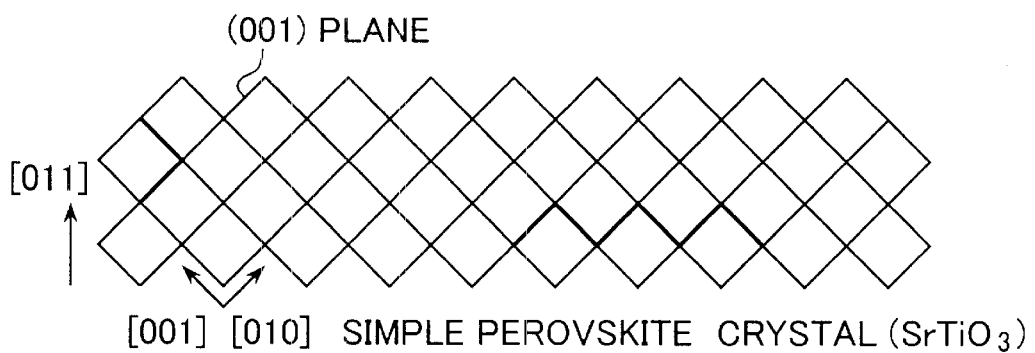

FIG. 6 is a cross-sectional view showing the lattice matching at the interface between (011)-oriented $SrTiO_3$ simple perovskite and $Bi_4Ti_3O_{12}$ layered perovskite in the epitaxial compound structures (4) to (9) of the invention, viewed from the $SrTiO_3$ [100]. The crystal structures are similar, and the lattice lengths of the $SrTiO_3$ (001) surface and the $Bi_4Ti_3O_{12}$ (001) surface are also the same, so growth of the two produces a natural match. Thus, basically the $Bi_4Ti_3O_{12}$ film is oriented as-is, and grows with the [117] normal to the simple perovskite surface or even, in some cases, with the [001] parallel to the surface. Here, a $Bi_4Ti_3O_{12}$ film grown with the [117] normal to the simple perovskite surface is called a (117)-oriented film.

The epitaxial compound structures (1) to (9) are fabricated on a substrate suitable for each structure, by sequentially supplying the required starting materials, setting the temperature and material delivery rates required to achieve the epitaxial growth, which can be effected using the prior art vapor-phase epitaxy, spin coating, liquid-phase epitaxy or other such epitaxial growth method. Vapor-phase methods that can be used include laser ablation, electron-beam deposition, flash deposition, ion plating, RF-magnetron sputtering, molecular beam epitaxy (MBE), chemical vapor deposition (CVD), plasma CVD, and metal-organic chemical vapor deposition. Spin coating can be done by the sol-gel method, metal-organic decomposition method or other such method.

Figure 7:
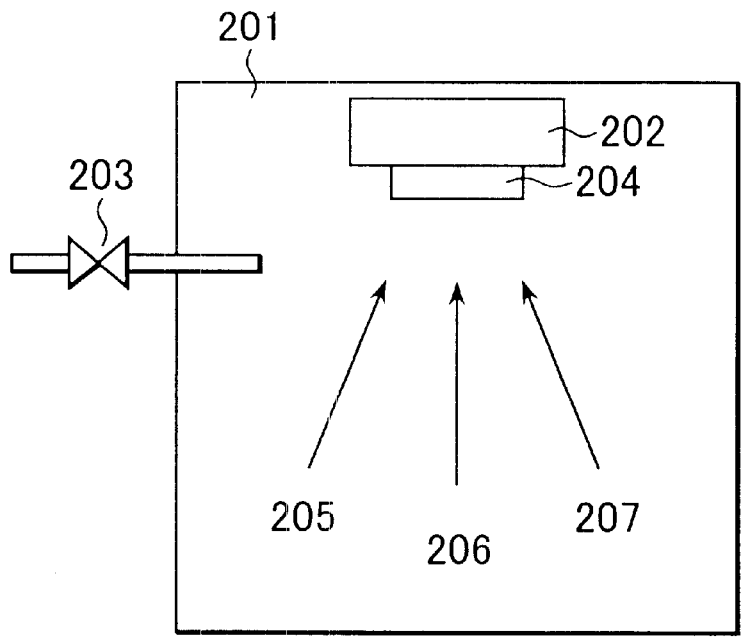
FIG. 7 is an explanatory diagram of the vapor-phase growth apparatus used by the present invention.

FIG. 7 is an explanatory diagram of the vapor-phase growth apparatus used by the present invention. In FIG. 7, reference numeral 201 denotes a vacuum apparatus used to fabricate the film by vapor deposition, numeral 202 denotes a heater used to maintain the substrate at the growth temperature, numeral 203 denotes a means of introducing gases into the vacuum apparatus, and numeral 204 denotes the substrate on which films are grown.

Reference numerals 205, 206 and 207 show the supply of fluorite, simple perovskite and layered perovskite starting materials, respectively. Using the apparatus, the epitaxial compound structures of the invention are grown on each substrate by sequentially supplying the starting materials concerned while using suitable temperatures and gas flow rates for growing the films.

Figure 8:
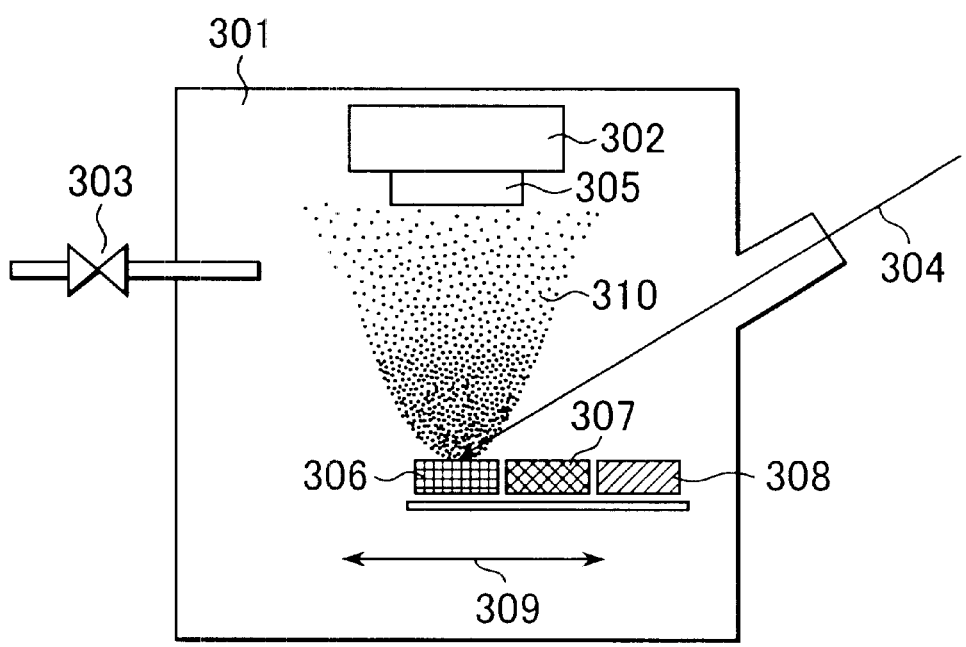
FIG. 8 is an explanatory diagram of the preferred laser ablation method to be used as the vapor-phase growth method in the present invention.

FIG. 8 is an explanatory diagram of laser ablation used as a preferred vapor-phase growth method. In FIG. 8, reference numeral 301 denotes a vacuum apparatus used for growing films by the laser ablation method, numeral 302 denotes a heater for heating the substrate, numeral 303 denotes a means of introducing gases into the vacuum apparatus, and numeral 304 denotes a means used to focus a laser beam on a target. Reference numeral 305 denotes the substrate on which the films are deposited. Reference 306 denotes a target for fabricating fluorite film on a substrate, numeral 307 denotes a target for fabricating simple perovskite on the substrate, and numeral 308 denotes a target for fabricating a layered perovskite structure on the substrate. Reference numeral 309 denotes a means for moving targets to the laser irradiation position. Reference numeral 310 shows target material spraying onto the substrate.

In the laser ablation method, the target is ablated by a laser beam, and the ablated material is deposited on the substrate to thereby grow a film. In some cases the chemical composition of the target is adjusted beforehand to obtain films having the required chemical composition. In order to produce high-quality films, the temperature and pressure-inside the apparatus must be set at the right levels for each of the film materials concerned. This is done using the heater 302 and gas introduction means 303. To ensure high-quality films, the laser focusing means 304 may be used to adjust laser wavelength, intensity, irradiation cycle frequency, angle of incidence, and so forth. During the growth procedure, the target movement means 309 is used to move each target into position in the required sequence.

As described in the foregoing, in the fabrication of the epitaxial compound structures (1) to (9), of the many component crystal materials known in the prior art, materials having fluorite and simple perovskite structures are specifically selected and combined to enable films having a simple perovskite structure to be epitaxially grown with a (011) orientation on substrates having a fluorite structure. Because layered perovskite grown on the simple perovskite structure has a crystal orientation close to perpendicular to the [001] at which the crystal exhibits optimum characteristics, the epitaxial compound structures thus obtained have a markedly higher performance and reliability than the (001)-oriented structures of the prior art, and can also be used to fabricate devices having higher integration.

In particular, ferroelectric devices fabricated using the epitaxial compound structure (7) (a ferroelectric material having a layered perovskite crystal structure) of the invention can utilize crystal orientations having a high polarization and coercive electric field. This makes it applicable to ferroelectric memories that use ferroelectric polarization to accumulate charges, and ferroelectric transistors in which polarization orientation is used to control electrical conduction. In addition, the high quality and uniform orientation of the film structure can provide a major contribution to increasing the performance and integration of such devices.

In superconducting devices fabricated using the epitaxial compound structure (8) (a superconducting material having a layered perovskite crystal structure), electrical flow in the thickness direction of the film is greatly facilitated compared to the prior art structures. This makes it applicable to the development of stacked-cell Josephson-junction devices, in addition to which the high quality and uniform orientation of the film structure can provide a major contribution to increasing the performance and integration of such devices.

Examples of the invention will now be explained in further detail in the following. However, it is to be understood that the invention is not limited by these examples.

EXAMPLE 1

Fabrication of Epitaxial Compound Structure (1)

The laser ablation apparatus of FIG. 8 was used to fabricate the epitaxial compound structure (1) of the present invention. $CeO_2$ was used as the fluorite and $SrTiO_3$ as the simple perovskite. First, a (001)-oriented film of $CeO_2$ was grown epitaxially on a (001)-oriented substrate of $SrTiO_3$ single-crystal. Then, a film of $SrTiO_3$ was grown on the $CeO_2$ layer.

The following growth conditions were used.

| | |
|---|---|
| Laser wavelength | 248 nm |
| Laser pulse energy | 300 mJ |
| Laser pulse duration | 25 ns |
| Laser incident angle | 30 deg. |
| System vacuum | $1 \times 10^{-6}$ Torr |
| Target-substrate distance | 5.5 cm |
| $CeO_2$ growth substrate temperature | 700° C. |
| $CeO_2$ growth oxygen flow | 0.5 sccm |
| $CeO_2$ growth vacuum | $5 \times 10^{-5}$ Torr |
| Laser irradiation cycle frequency for $CeO_2$ | 2 Hz |
| $CeO_2$ growth rate | 5 nm/min |
| $CeO_2$ growth duration | 8 min |
| $SrTiO_3$ growth substrate temperature | 700° C. |
| $SrTiO_3$ growth oxygen flow | 0.5 sccm |
| $SrTiO_3$ growth vacuum | $5 \times 10^{-5}$ Torr |
| Laser irradiation cycle frequency for $SrTiO_3$ | 10 Hz |
| $SrTiO_3$ growth rate | 8 nm/min |
| $SrTiO_3$ growth duration | 24 min |

Identification of Epitaxial Compound Structure (1)

The epitaxial compound structure (1) was identified by x-ray diffraction and the like.

Figure 9:
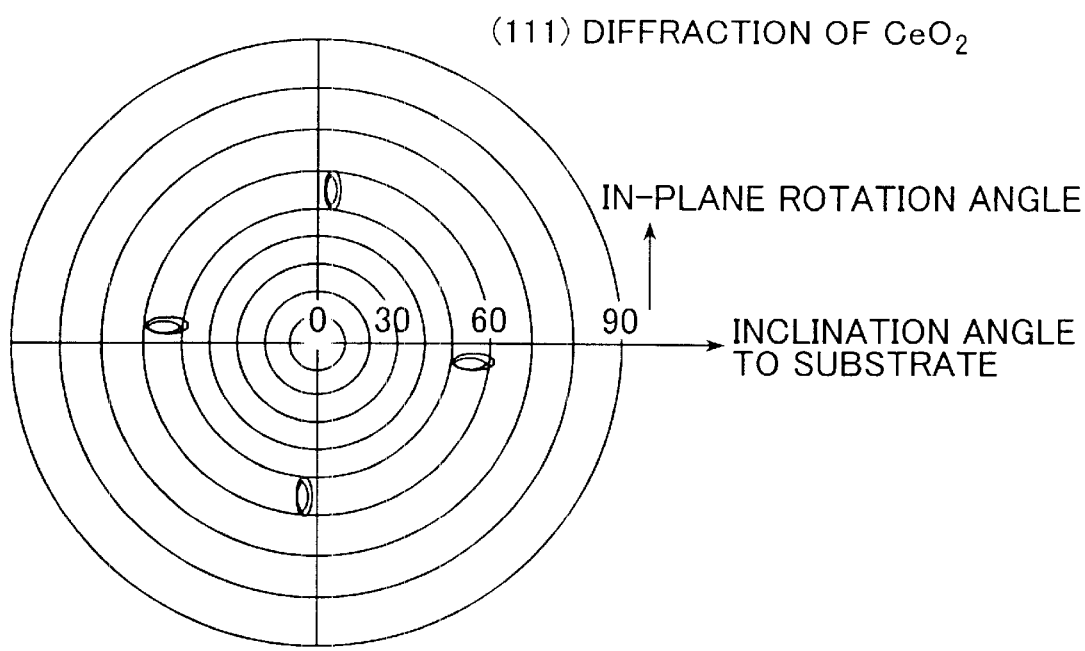
FIG. 9 shows an x-ray diffraction pattern of the epitaxial compound structure of Example 1.
Figure 9:
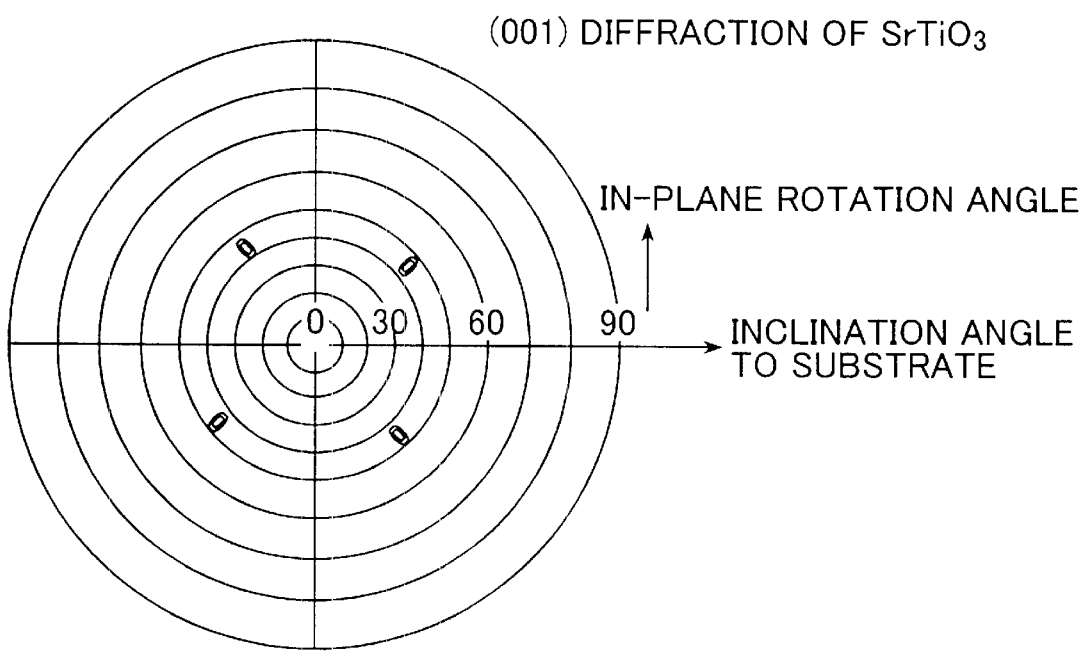
Figure 10:
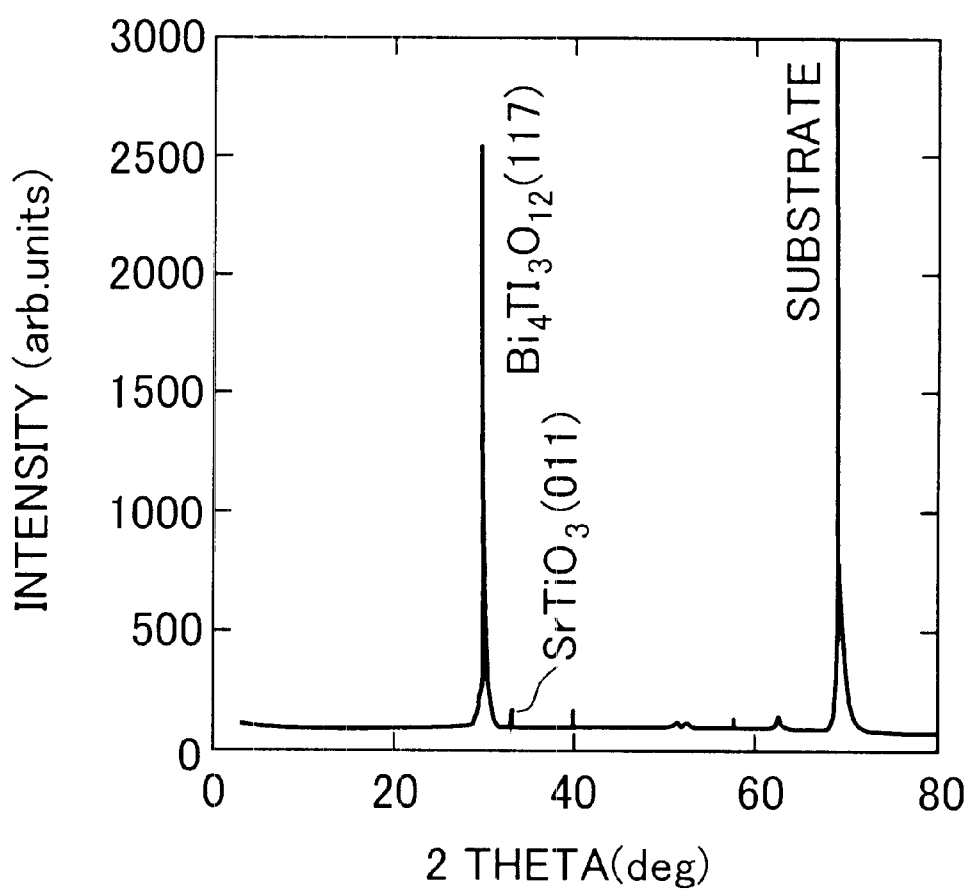
FIG. 10 shows pole-figure measurements of in-plane orientation of a film of the epitaxial compound structure of Example 1, obtained by x-ray diffraction.

The results are shown in FIGS. 9 and 10. FIG. 9 is an x-ray diffraction pattern obtained from the epitaxial compound structure (1). A strong diffraction peak was obtained from the single-crystal $SrTiO_3$ substrate used. From the $CeO_2$ layer grown on the substrate, a (002)-plane diffraction peak was obtained that is characteristic of (001)-oriented growth. The (011) and (022) diffraction peaks obtained from the $SrTiO_3$ layer grown on the $CeO_2$ layer are also characteristic of a (011) orientation. FIG. 10 shows pole-figure measurements of the in-plane orientation of films of the epitaxial compound structure (1), obtained by x-ray diffraction. As can be seen, (111) diffraction of the $CeO_2$ fluorite film is inclined 55 degrees to the substrate with fourfold symmetry. Also, the (001) diffraction of the $SrTiO_3$ simple perovskite film is inclined 45 degrees to the substrate with fourfold symmetry. Thus, there is an in-plane angle offset of 45 degrees between the (111) diffraction of the $CeO_2$ film and the (001) diffraction of the $SrTiO_3$ film. From FIGS. 9 and 10, it can be ascertained that the epitaxial growth of FIG. 5 is realized in the epitaxial compound structure (1) of this Example. Moreover, as explained with reference to FIG. 5, because in the crystal surface of (001)-oriented $CeO_2$ [100] and [010] are the same, (011)-oriented film of simple perovskite having twofold symmetry grows epitaxially in two directions rotated 90 degrees in the surface plane, which shows up in the pole-figures as fourfold symmetry.

EXAMPLE 2

Fabrication of Epitaxial Compound Structure (7)

The laser ablation apparatus of FIG. 8 was used to fabricate the epitaxial compound structure (7) of the present invention, using (001)-oriented silicon for the substrate, $Ce_{0.12}Zr_{0.88}O_2$ as the fluorite, $SrTiO_3$ as the simple perovskite, and a ferroelectric material, $Bi_4Ti_3O_{12}$, with a layered perovskite structure.

The following growth conditions were used.

| | |
|---|---|
| Laser wavelength | 248 nm |
| Laser pulse energy | 300 mJ |
| Laser pulse duration | 25 ns |
| Laser incident angle | 30 deg. |
| System vacuum | $1 \times 10^{-6}$ Torr |
| Target-substrate distance | 5.5 cm |
| $Ce_{0.12}Zr_{0.88}O_2$ growth substrate temperature | 700° C. |
| $Ce_{0.12}Zr_{0.88}O_2$ growth oxygen flow | 0.5 sccm |
| $Ce_{0.12}Zr_{0.88}O_2$ growth vacuum | $5 \times 10^{-5}$ Torr |
| Laser irradiation cycle frequency for $Ce_{0.12}Zr_{0.88}O_2$ | 2 Hz |
| $Ce_{0.12}Zr_{0.88}O_2$ growth rate | 1.2 nm/min |
| $Ce_{0.12}Zr_{0.88}O_2$ growth duration | 4 min |
| $SrTiO_3$ growth substrate temperature | 700° C. |
| $SrTiO_3$ growth oxygen flow | 0.5 sccm |
| $SrTiO_3$ growth vacuum | $5 \times 10^{-5}$ Torr |
| Laser irradiation cycle frequency for $SrTiO_3$ | 2 Hz |
| $SrTiO_3$ growth rate | 1.6 nm/min |
| $SrTiO_3$ growth duration | 2 min |
| $Bi_4Ti_3O_{12}$ growth substrate temperature | 700° C. |
| $Bi_4Ti_3O_{12}$ growth oxygen flow | 8 sccm |
| $Bi_4Ti_3O_{12}$ growth vacuum | 100 mTorr |
| Laser irradiation cycle frequency for $Bi_4Ti_3O_{12}$ | 10 Hz |
| $Bi_4Ti_3O_{12}$ growth rate | 8.4 nm/min |
| $Bi_4Ti_3O_{12}$ growth duration | 60 min |

Identification of Epitaxial Compound Structure (7)

Figure 11:
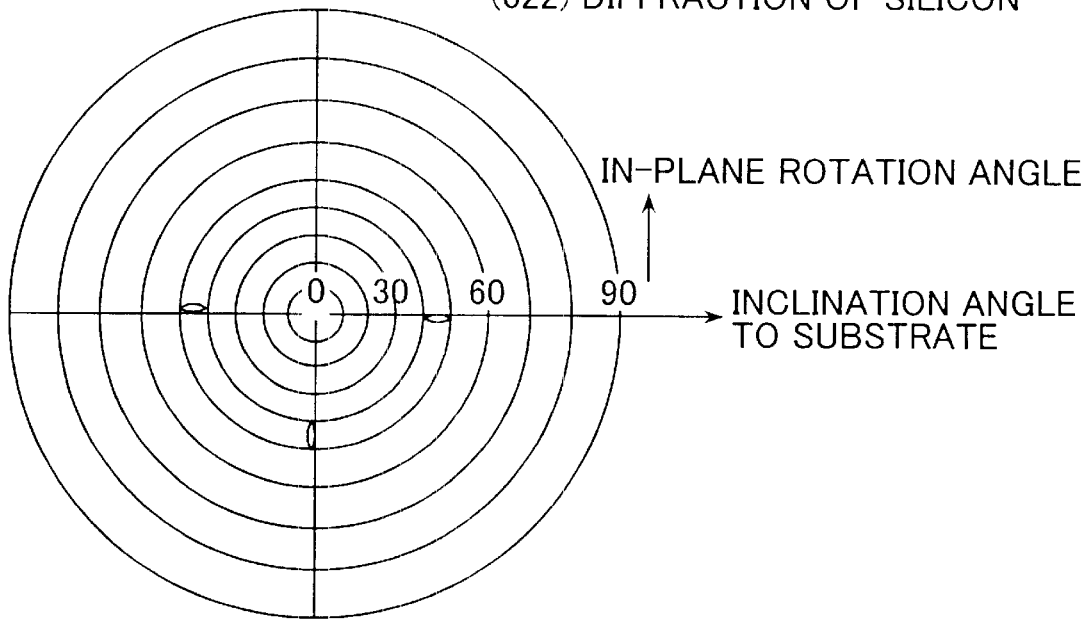
FIG. 11 shows an x-ray diffraction pattern of the epitaxial compound structure of Example 2.
Figure 11:
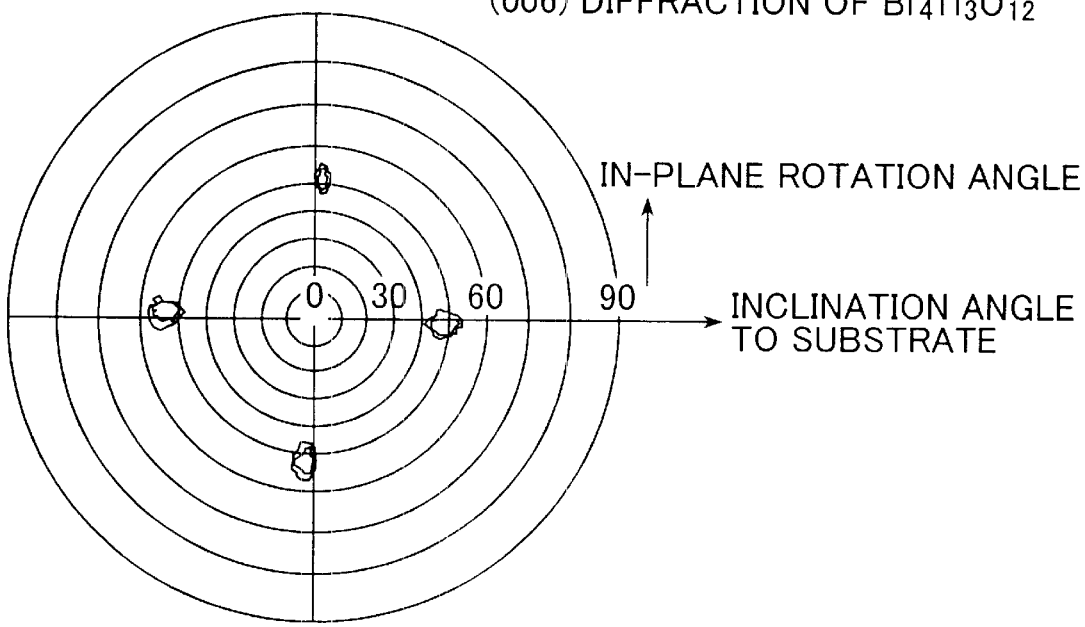
Figure 12:
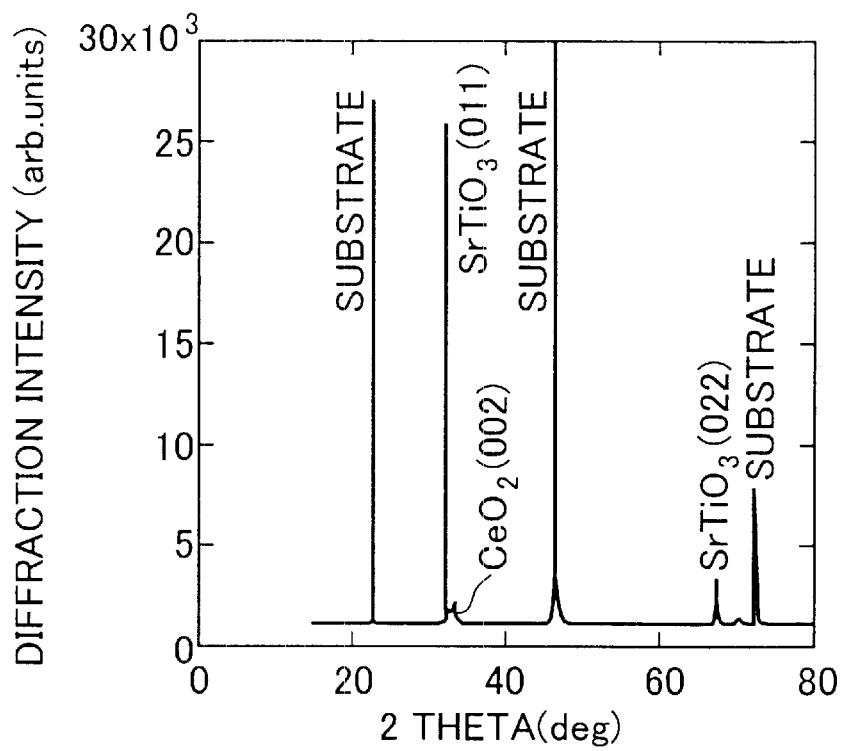
FIG. 12 shows pole-figure measurements of in-plane orientation of a film of the epitaxial compound structure of Example 2, obtained by x-ray diffraction.

The epitaxial compound structure (7) was identified by x-ray diffraction and the like. The results are shown in FIGS. 11 and 12. FIG. 11 shows an x-ray diffraction pattern of the epitaxial compound structure (7) comprising the (001)-oriented silicon substrate on which a film of $Ce_{0.12}Zr_{0.88}O_2$ fluorite is epitaxially grown with a (001) orientation, followed by a film of $SrTiO_3$ perovskite grown epitaxially with a (011) orientation, and a film of a ferroelectric material, $Bi_4Ti_3O_{12}$, with a layered perovskite structure.

A strong (117) diffraction peak was obtained from the $Bi_4Ti_3O_{12}$. There were no diffraction peaks related to the (001) orientation. FIG. 12 shows pole-figure measurements of the in-plane orientation of films of the epitaxial compound structure (7), obtained by x-ray diffraction. As can be seen, (022) diffraction of the (001) silicon substrate is inclined 45 degrees to the substrate with fourfold symmetry. The (006) diffraction of the $Bi_4Ti_3O_2$ film is also inclined 45 degrees to the substrate with fourfold symmetry, and the in-plane angle also matches the (022) diffraction of the silicon substrate. From FIGS. 11 and 12, it can be ascertained that, as shown in FIG. 6, in the epitaxial compound structure (7) comprising the (001)-oriented silicon substrate on which are formed an epitaxial film of (001)-oriented $Ce_{0.12}Zr_{0.88}O_2$, followed by an epitaxial film of (01 1)-oriented $SrTiO_3$ and a film of $Bi_4Ti_3O_{12}$ the $Bi_4Ti_3O_{y2}$ film is epitaxially grown with a non-(001) orientation.

EXAMPLE 3

Figure 13:
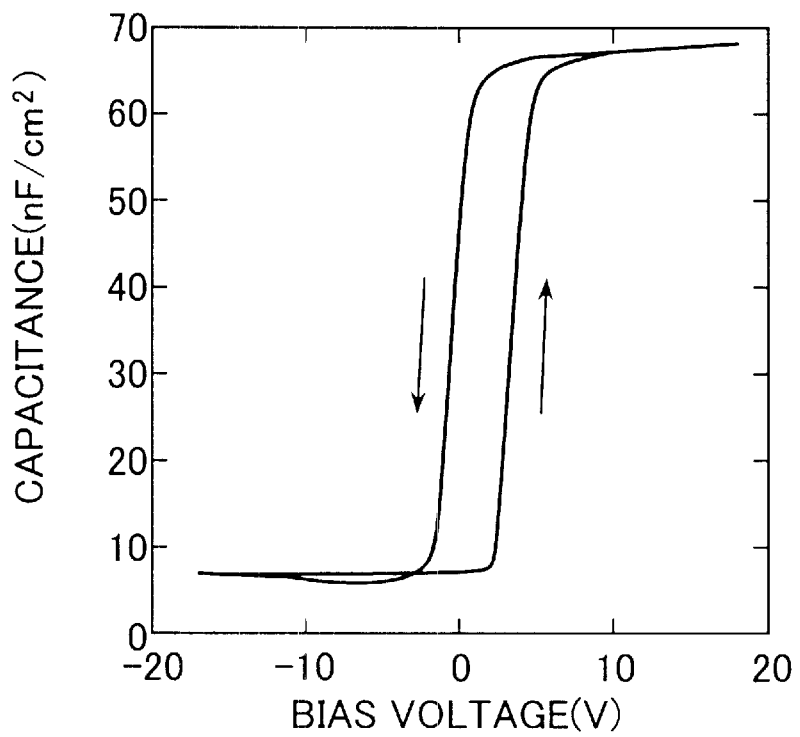
FIG. 13 is a graph showing the relationship between capacitance and bias in the ferroelectric device of Example 3.

The epitaxial compound structure (7) of Example 2 was used to fabricate a ferroelectric device according to the present invention. The device was fabricated with a capacitance structure, with the electron-beam deposition method being used to form metal electrodes on the upper ferroelectric material portion and lower silicon portion. To evaluate device characteristics, the capacitance was measured at varying voltages. The results are shown in FIG. 13. For the measurement, using a measurement frequency of 1 megahertz, the voltage was adjusted from −18 volts to +18 volts, and then back down to −18 volts. The capacitance reflected changes in the electronic states in the vicinity of the silicon surface. A carrier depletion state was exhibited at negative voltages, and a carrier accumulation state at positive voltages. The voltages at which a change gave rise to a sharp change in capacitance differed depending on the direction in which the voltage was changed. The hysteresis exhibited was caused by ferroelectric polarization. This shows that a ferroelectric device obtained using the epitaxial compound structure (7) of the present invention exhibits high-performance memory characteristics.

Thus, with respect to the epitaxial compound structures (1) to (9), of the many component crystal materials known in the prior art, materials having fluorite and simple perovskite structures are specifically selected and combined to enable films having a simple perovskite structure to be epitaxially grown with an (011) orientation, not the (001) orientation of the prior art, on the fluorite substrate. Because layered perovskite grown on the simple perovskite structure has a crystal orientation that is close to perpendicular to the [00] at which the crystal exhibits optimum properties, the epitaxial compound structure materials thus formed have a markedly higher performance and reliability than the (001)-oriented structures of the prior art, and can also be used to fabricate devices having higher integration.

Also, ferroelectric devices fabricated from the epitaxial compound structure (7) of the invention can utilize crystal orientations having a high polarization and coercive electric field.

This makes it applicable to ferroelectric memories that use ferroelectric polarization to accumulate charges, and ferroelectric transistors in which polarization orientation is used to control electrical conduction. In addition, the high quality and uniform orientation of the film structure can provide a major contribution to increasing the performance and integration of such devices.

With superconducting devices fabricated from the epitaxial compound structure (8) of the invention, electrical flow in the thickness direction of the film is greatly facilitated, compared to the prior art structures. This makes the material applicable in the field of development of stacked-cell Josephson-junction devices, in addition to which the high quality and uniform orientation of the film structure can provide a major contribution to increasing the performance and integration of such devices.

What is claimed is:

1. An epitaxial compound structure, comprising a (001)-oriented film of fluorite crystal, and a (011)-oriented film of simple perovskite crystal grown epitaxially on said film of fluorite crystal.

2. An epitaxial compound structure according to claim 1, wherein said film of fluorite crystal is (001)-oriented film epitaxially grown on a conductive crystal.

3. An epitaxial compound structure according to claim 2, wherein said conductive crystal is silicon.

4. An epitaxial compound structure, comprising a (001)-oriented film of fluorite crystal, a (011)-oriented film of simple perovskite type crystal grown epitaxially on said film of fluorite crystal, and a crystal film having a layered perovskite crystal structure grown epitaxially on said film of simple perovskite crystal.

5. An epitaxial compound structure according to claim 4, wherein said film of fluorite crystal is a (001)-oriented film epitaxially grown on a conductive crystal.

6. An epitaxial compound structure according to claim 5, wherein said conductive crystal is silicon.

7. An epitaxial compound structure according to claim 4, wherein said crystal film having a layered perovskite crystal structure is a ferroelectric material.

8. An epitaxial compound structure according to claim 5, wherein said crystal film having a layered perovskite crystal structure is a ferroelectric material.

9. An epitaxial compound structure according to claim 6, wherein said crystal film having a layered perovskite crystal structure is a ferroelectric material.

10. An epitaxial compound structure according to claim 4, wherein said crystal film having a layered perovskite crystal structure is a superconducting material.

11. An epitaxial compound structure according to claim 5, wherein said crystal film having a layered perovskite crystal structure is a superconducting material.

12. An epitaxial compound structure according to claim 6, wherein said crystal film having a layered perovskite crystal structure is a superconducting material.

13. An epitaxial compound structure according to claim 4, wherein said crystal film having a layered perovskite crystal structure is a magnetic material.

14. An epitaxial compound structure according to claim 5, wherein said crystal film having a layered perovskite crystal structure is a magnetic material.

15. An epitaxial compound structure according to claim 6, wherein said crystal film having a layered perovskite crystal structure is a magnetic material.

16. A ferroelectric device, comprised of the compound structure of claim 7.

17. A ferroelectric device, comprised of the compound structure of claim 8.

18. A ferroelectric device, comprised of the compound structure of claim 9.

19. A superconducting device, comprised of the compound structure of claim 10.

20. A superconducting device, comprised of the compound structure of claim 11.

21. A superconducting device, comprised of the compound structure of claim 12.

* * * * *